United States Patent
Ryan et al.

(10) Patent No.: US 6,389,565 B2
(45) Date of Patent: *May 14, 2002

(54) MECHANISM AND DISPLAY FOR BOUNDARY-SCAN DEBUGGING INFORMATION

(75) Inventors: Heather M. Ryan; Kenneth P. Parker, both of Fort Collins; Robert Mayrus Tromp, Loveland, all of CO (US)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/086,805

(22) Filed: May 29, 1998

(51) Int. Cl.[7] ............... H02H 3/05; H03K 19/003; H04B 1/74; H04L 1/22; H05K 10/00

(52) U.S. Cl. ............... 714/724; 345/100; 345/186; 714/727

(58) Field of Search ................ 714/726, 727, 714/46, 719, 723, 25; 326/38–39; 345/431, 186, 549, 440, 434, 443, 548, 117, 100; 703/20–21; 710/22; 716/5

(56) References Cited

U.S. PATENT DOCUMENTS

| | | | | |
|---|---|---|---|---|
| 5,253,255 A | * | 10/1993 | Carbine | 714/734 |
| 5,299,139 A | * | 3/1994 | Baisuck et al. | 364/491 |
| H1506 H | * | 12/1995 | Beretta | 345/431 |
| 5,627,840 A | | 5/1997 | Hundertmark et al. | 714/726 |
| 5,784,377 A | | 7/1998 | Baydar et al. | 370/463 |
| 5,821,773 A | | 10/1998 | Norman et al. | 326/39 |
| 5,828,579 A | * | 10/1998 | Beausang | 395/500.03 |
| 5,869,979 A | | 2/1999 | Bocchino | 326/38 |
| 5,970,241 A | | 10/1999 | Deao et al. | 395/568 |
| 6,026,230 A | | 2/2000 | Lin et al. | 395/500.34 |
| 6,028,983 A | | 2/2000 | Jaber | 395/183.06 |
| 6,032,268 A | | 2/2000 | Swoboda et al. | 714/30 |
| 6,047,390 A | | 4/2000 | Butt et al. | 714/43 |
| 6,243,665 B1 | * | 6/2001 | Nagoya et al. | 703/20 |

OTHER PUBLICATIONS

Stark (Enclyclpedia of LOTUS 1–2–3. 1st Edition, 1987. pp. 125, 138).

Bou–Farhat, etal. (The Implementation of a Testable High Performance Display Controller. IEEE, 1988).

Parker, Kenneth P., "The Boundary–Scan Handbook", ISBN 0–7923–9270–1, Kluwer Academic Publishers, 1992, pp 1–140.

* cited by examiner

*Primary Examiner*—Albert Decady
*Assistant Examiner*—Guy Lamarre

(57) ABSTRACT

A graphical user interface for displaying boundary scan test data, and method for producing the same, is presented. The user interface display allows a user to view boundary scan test data from a boundary scan testing device in a format well-suited for debugging. Serial data received from the testing device is organized into a parallel format to display predicted versus actual data values on a per node basis, to show how a node is passing or failing. In a preferred embodiment, the user views the frame cell number in the boundary scan chain, the device cell number within a device at that point of the chain, the device name, the pin of the device associated with the cell, the node associated with the pin, the predicted value for the cell, the actual value for the cell as if differs from the predicted value if it differs, and the cell numbers for drivers that match predicted and actual data. Frame cells can be displayed in numerical or sorted boundary scan chain order, failing status only, or passing status only. The preferred embodiment display has the capability to display interesting correlations in the data to assist the user in debugging the circuit under test, including devices driving at fail, devices receiving at fail, devices driving only passes, devices receiving only passes, nodes always failing, nodes sometimes failing, and nodes always passing.

20 Claims, 7 Drawing Sheets

| FRAME CELL NUMBER | DEVICE BOUNDARY SCAN CELL NUMBER | DEVICE & CONNECTING PIN | NODE NAME | PREDICTED VALUE DATA | |
|---|---|---|---|---|---|
| 8 | 8 | U4.15 | U1_U3_10 | HLLLHHHLH | |
| 9 | 9 | U4.16 | U1_U3_9 | LHHHLLLLH | |
| 10 | 10 | U4.17 | U1_U2_8 | LHHLLLHLH | |
| 11 | 11 | U4.19 | U1_U3_7 | LHLHLHLLH | |
| 12 | 12 | U4.20 | U1_5 | LHLLLHHLH | |
| 13 | 13 | U4.21 | U3_4 | HLHHHLLLH | |
| 44 | 8 | U2.15 | U1_U3_10 | HLLLHHHLH | |
| 45 | 9 | U2.16 | U1_U3_9 | LHHHLLLLH | |
| 46 | 10 | U2.17 | U1_U3_8 | LHHLLLHLH | |
| 50 | 14 | U2.22 | U1_3 | LLHLHLHLH | |
| 51 | 15 | U2.23 | U1_2 | LLLHHHLLH | |
| 54 | 0 | U1.10 | U1_U3_10 | 100011101 | |
| 55 | 1 | U1.9 | U1_U3_9 | 011100001 | |
| 56 | 2 | U1.8 | U1_U3_8 | 011000101 | |
|   |   |   |   | ← FRAME 1 ... FRAME 9 → | |

FIG. 4

```
500
     512   514 516 518 520  522 524 526 528
510— U1_U3_10 000008 8 U4 15 HLLLHHHLH * 2 2 0
     U1_U3_9  000009 9 U4 16 LHHHLLLLH -LLL----L 1 1 1
     U1_U2_8  000010 10 U4 17 LHHLLLHLH --LH-HL-- 2 3 1
     U1_U2_7  000011 11 U4 19 LHLHLHLLH --HL-LH-- 3 2 1
     U1_5     000012 12 U4 20 LHLLLHHLH * 6 6 0
     U1_U3_10 000044 8 U2 15 HLLLHHHLH * 2 2 0
     U1_U3_9  000045 9 U2 16 LHHHLLLLH -LLL----L 1 1 1
     U1_U2_8  000046 10 U2 17 LHHLLLHLH --LH-HL-- 2 3 1
     U1_U2_7  000047 11 U2 19 LHLHLHLLH --HL-LH-- 3 2 1
     U1_3     000050 14 U2 22 LLHLHLHLH * 4 4 0
     U1_2     000051 15 U2 23 LLLHHHLLH * 5 5 0
     U1_U3_10 000008 8 U4 15 100011101 * -1 -2 0
     U1_U3_9  000009 9 U4 16 011100001 -000----0 -1 -2 1
     U1_U2_8  000010 10 U4 17 011000101 --01-01-- -1 -2 1
     U1_U2_7  000011 11 U4 19 010101001 --10-01-- -1 -2 1
                              :
```

FIG. 5

MECHANISM AND DISPLAY FOR BOUNDARY-SCAN DEBUGGING INFORMATION

FIELD OF THE INVENTION

The present invention relates generally to the field of electrical circuit testing, and more particularly, to a method and system for displaying boundary scan debugging information.

BACKGROUND OF THE INVENTION

The testing of electrical circuits is an essential portion of the process involved in the design and manufacture of electrical circuits. The development of a test that is known to run on a known good board is an essential step in setting up manufacturing tests. Once a test is known to be a good test, it may be run on boards under manufacture to accurately identify whether they are passing or failing.

During the development of a test, the test may fail when run on a known good board. The cause of the failed test may be that the test vectors are inaccurate, the netlist information about the board is inaccurate, or the implementation of the test support system in one or more of the board components are not implemented correctly. A need exists for a tool that assists the test engineer in developing a known good test by pinpointing the causes of test failures when running the test on a known good board.

One test that is often developed is known as boundary scan. Boundary scan is a test system in which each component of a circuit to be tested is constructed with a set of shift registers placed between each device pin and with a specific internal logic system. This system has been defined in an Institute of Electrical and Electronic Engineers (IEEE) standard 1149.1–1990. The boundary scan standard allows the entire circuit to be accurately tested by scanning only the boundary pins of the circuit. For a complete description of boundary scan testing, see Parker, Kenneth P., *The Boundary Scan Handbook*, ISBN0-7923-9270-1 (1992).

To run a boundary scan test requires that the circuit under test include boundary scan functionality. FIG. 1 is a block diagram of a boundary scan component 100. Boundary scan component 100 includes internal logic 106 that is coupled to receive input data via input pins 102 and to output output data via output pins 104. Each input pin 102 and output pin 104 of interest is coupled to a separate boundary cell 110 in a boundary scan register 108. Boundary scan cells 110 are coupled serially in a loop configuration. Boundary scan test pins TDI 112, TCK 114, TDO 116, and TMS 118 are provided as dedicated boundary scan test pins that have the ability to electrically contact bed-of-nails fixture probes. Test Clock (TCK) pin 114 and Test Mode Select (TMS) pin 118 are both coupled to a Test Access Port (TAP), and are used to implement a boundary scan communication protocol. At any given time, Test Data In (TDI) pin 112 and Test Data Out (TDO) pin 116 are each switchably coupled to one of the boundary scan register 108, an instruction register 140, or a bypass register 150.

Boundary scan instruction register 140 is used to set the mode of operation for one or more data registers 150 and 160. When testing one or more specific boundary scan components that are linked in a chain of components, bypass register 150 is used to shorten the chain of cells to a single boundary scan cell through a boundary scan component. The boundary-scan communication protocol, which is also known as the "JTAG" (Joint Test Action Group) protocol, is described in detail. in the IEEE/ANSI Standard 1149.1-1990.

In operation, instructions are loaded into instruction register 140 under the control of TMS pin 118 and TCK pin 114 via TDI pin 112. The instruction present in instruction register 140 determines which of boundary scan register 108, data registers 160, or bypass register 150 is coupled between TDI pin 112 and TDO pin 116. Data is shifted into the currently selected register 108, 150, or 160 via TDI pin 112 in synchronization with a clock signal received on TCK pin 114. When data is shifted into cells 110 of boundary scan register 108, the bit values shifted into the cells 110 are seen on the respective pins 102, 104 that the corresponding cells are coupled to. A boundary scan tester (not shown) probes the pins 102, 104 of interest to capture the actual value seen on the pins.

Boundary scan testing is usefull for testing electrical circuits that include multiple cross-connected integrated circuits. In this configuration input signals may be applied to one integrated circuit that lies in a chain of multiple integrated circuits. Boundary scan testing allows the debug engineer to capture values driven by driving nodes and to compare them to the values received by their receiving nodes further down the chain. If the values do not match, this indicates an incorrect wiring or bad connection in the circuit under test.

FIG. 2 is a block schematic diagram of a circuit board that comprises two non-boundary scan components 230 and 240, and two boundary scan components 210 and 220 that are linked together to form one larger boundary scan chain. The chain is formed by connecting the TDO pin 218 of boundary scan component 210 to the TDI pin 226 of boundary scan component 220. Data is shifted serially through the cells in the chain from TDI pin 216 to TDO pin 228, an operation is performed, and the data collected for each cell in the chain is then shifted out of the chain through TDO pin 228. A full set of captured data, referred to herein as a "frame", includes a bit value captured for each boundary scan cell in the entire chain. Each frame sequence is shifted serially out of the chain and becomes the actual value data. The position of a bit in a given frame corresponds to the position of its cell number in the chain. Accordingly, the first bit in the frame corresponds to the first boundary scan cell (cell 0, closest to TDO) in the chain, the second bit in the frame corresponds to the second boundary scan cell (cell 1 in the chain) in the chain, and so on. The actual value captured on a given cell in the chain may be extracted by examining the bit in each frame that corresponds to the cell's position in the chain.

The overall test consists of multiple frames that are all concatenated together end to end in one long serial bitstream. Because boundary scan test data is by nature highly serialized, this means that a sequence of data being placed on a single pin or node during a test is scattered throughout a multitude of other bits. Prior art methods for extracting boundary scan vectors from a lengthy stream of serial bits has involved a process of detecting the beginning of the serialized stream of bits, keeping track of the count of bits received from the serialized stream, generating a set of vectors from the received bits, and matching each of the vectors to a set of predicted vectors. Accordingly, if even a single bit is not detected or is mis-detected, the set of actual vectors may become entirely mis-aligned with the set of predicted vectors when matching up the two sets of vectors.

Accordingly, a need exists for a method and interface for viewing predicted and actual boundary scan test data in aparallel format rather than in the serialized format of the prior art. A need also exists for a method and interface that allows the user to constrain, organize, and sort the test data being viewed to enhance the user's ability to pinpoint wiring or connect problems.

SUMMARY OF THE INVENTION

In accordance with the present invention, a graphical user interface for displaying boundary scan test data, and method for producing the same, is presented. The user interface display allows a user to view boundary scan test data generated by a boundary scan testing device in a format well-suited for debugging. Serial data received from the testing device is organized into a parallel format to, display predicted versus actual data values on a per node basis, to show how a node is passing or failing. In a preferred embodiment, the user views the frame cell number in the boundary scan chain, the device cell number within a device at that point of the chain, the device name, the pin of the device associated with the cell, the node associated with the pin, the predicted value for the cell, the actual value for the cell as it differs from the predicted value if it differs, and the cell numbers for drivers that match predicted and actual data. Frame cells can be displayed in numerical frame order, node name order, failing status only, or passing status only. The preferred embodiment display has the capability to display interesting correlations in the data to assist the user in debugging the circuit under test, including devices driving at fail, devices receiving at fail, devices driving only passes, devices receiving only passes, nodes always failing, nodes sometimes failing, and nodes always passing.

BRIEF DESCRIPTION OF THE DRAWING

The invention will be better understood from a reading of the following detailed description taken in conjunction with the drawing in which like reference designators are used to designate like elements, and in which:

FIG. 4 is an example of a predicted value data file;

FIG. 5 is an example parallel data packet file;

DETAILED DESCRIPTION

The present invention provides a technique for displaying serial boundary scan data in a parallel format, displaying both the predicted and actual circuit behavior of the circuit under test in a format useful to a debug engineer. A display in accordance with the invention is organized to quickly alert the user to mismatches in predicted versus actual boundary scan test data on a per frame per nodename basis. The method and interface of the invention allows the engineer to constrain, organize, search, sort, and correlate the data being viewed to enhance understanding of the tested circuit's behavior.

Figure 1:
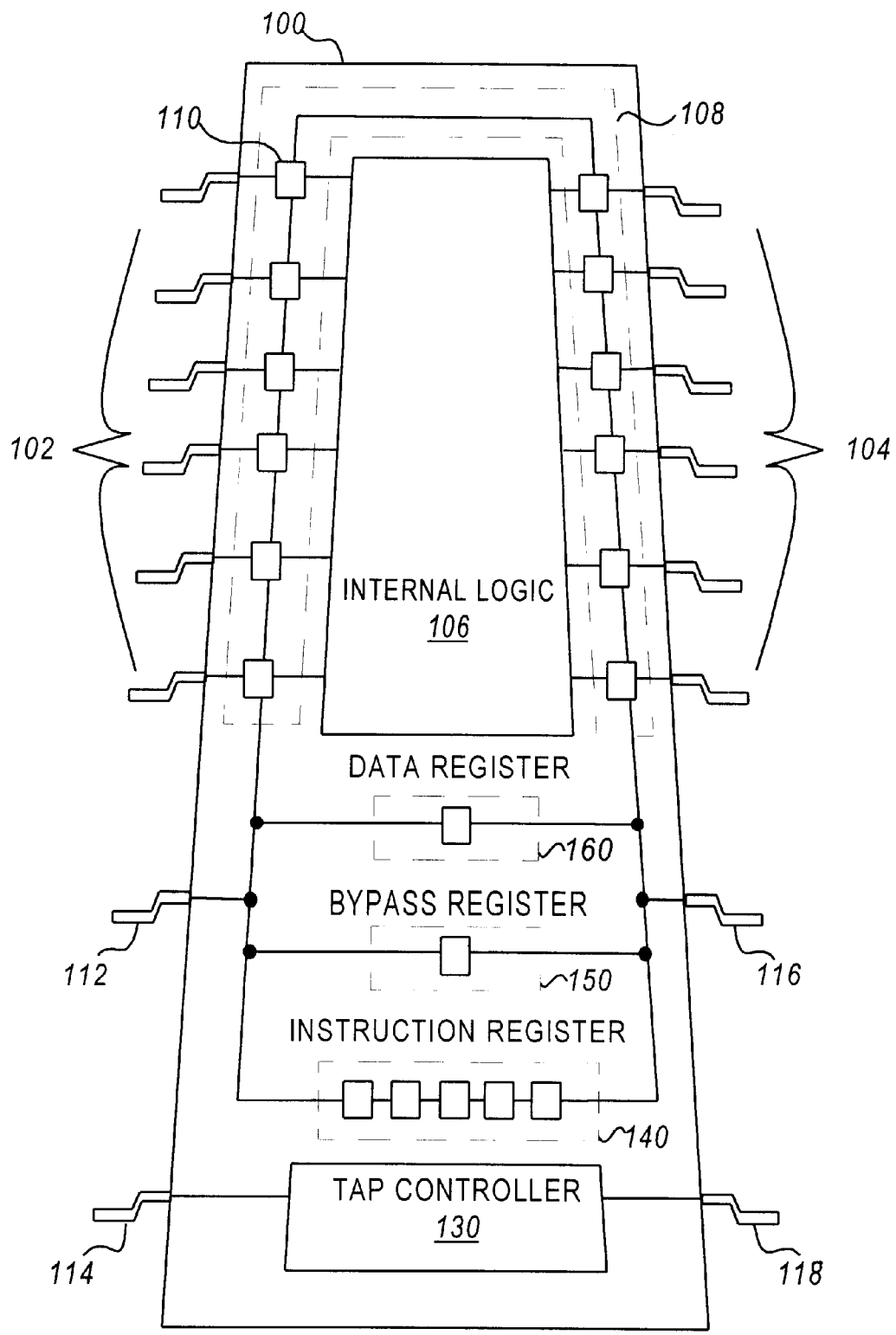
FIG. 1 is a block diagram of a boundary scan component.
Figure 2:
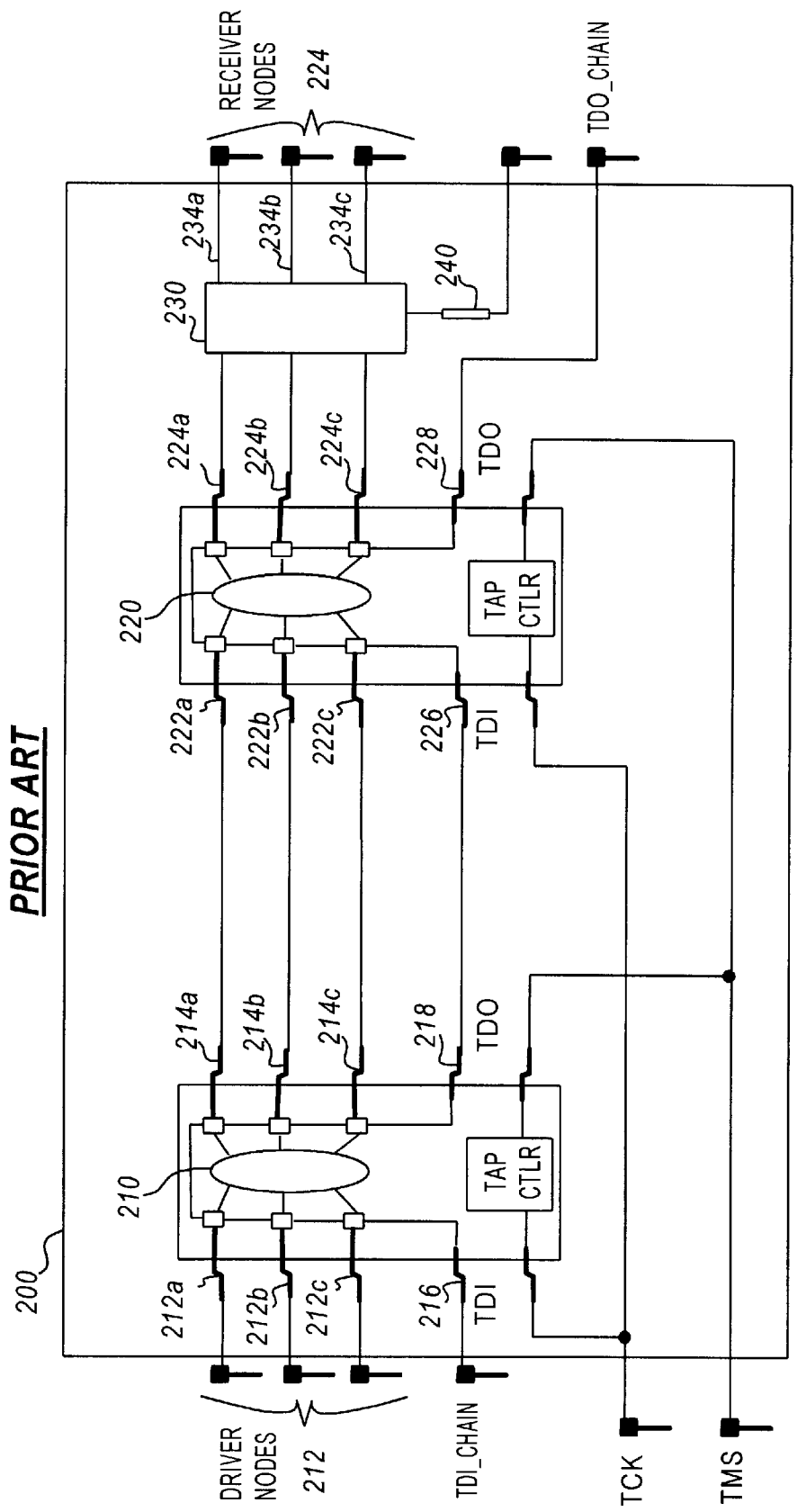
FIG. 2 is a block schematic diagram of a circuit board comprising boundary scan components linked together in a chain.
Figure 3:
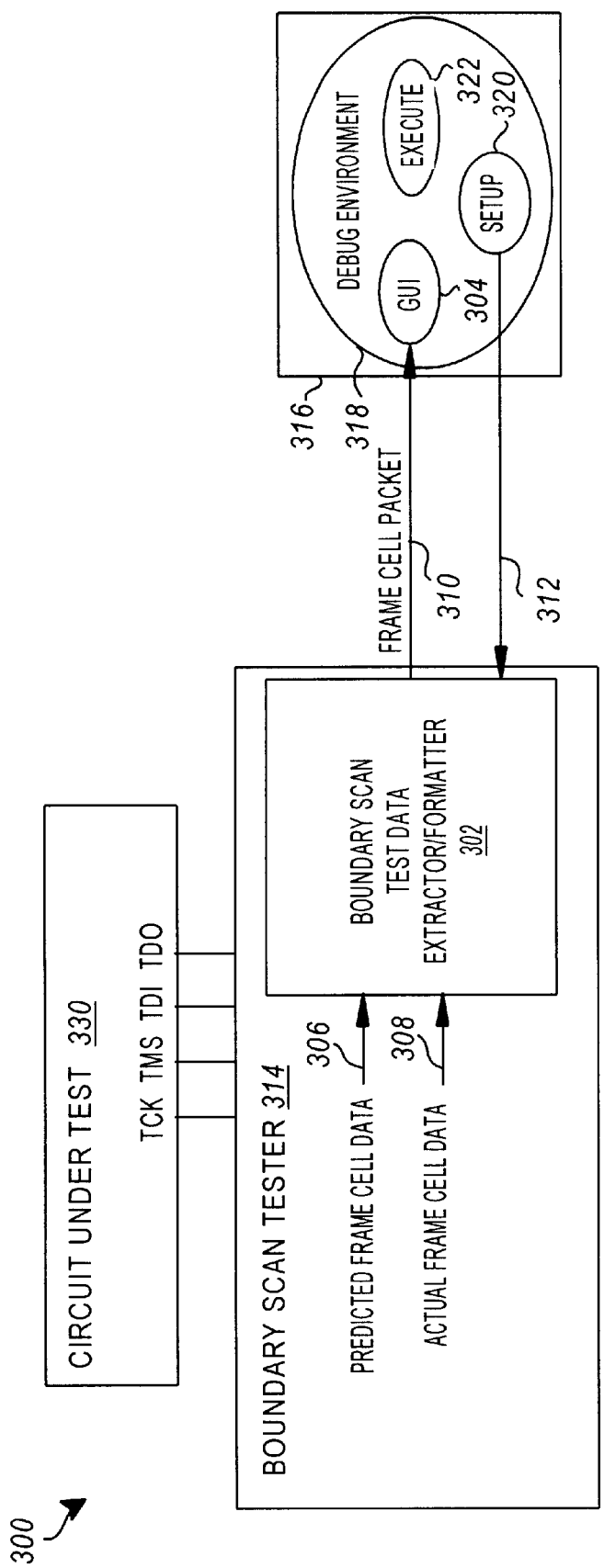
FIG. 3 is a block diagram of a system in accordance with the invention.

FIG. 3 is a block diagram of a system in accordance with the invention. System 300, includes a boundary scan data extractor/formatter 302 which receives predicted value data 306 and actual value data 308. Actual value data 308 is captured by a boundary scan testing device 314. Actual value data 308 is a serial bitstream comprising the bit values read on each sequential boundary scan cell in the boundary scan chain for each sequential frame shifted in by the tester. For each node of interest, boundary scan data extractor/formatter 302 extracts the bit value detected on the boundary scan cell coupled to the corresponding node of interest for each frame cell. Boundary scan data extractor/formatter 302 formats the captured bit value along with the predicted value data for that particular frame into a packet 310.

A graphical user interface 304 receives packets 310, extracts the predicted value and actual value from each packet 310, and displays the predicted value and actual value, along with other useful identifying information contained in the packet in a format useful to the user. The format of the display includes visual cues that alert the user to predicted value and actual value mismatches. In the preferred embodiment, this is accomplished by vertically aligning the predicted value and actual value for each frame cell, as well as color coding the display of information by using a first color to indicate a match and a second color to indicate a mismatch.

Each packet 310 includes information such as a node name, frame cell number, device cell name, pin number, predicted value, actual value, predicted driving cell, and actual driving cell.

FIG. 4 is an example file containing the format of circuit information 312 and predicted value data 306. File 400 includes a line for each node of interest. Each line includes (from left to right) a frame cell number, the boundary scan cell number in the chain associated with the node of interest, the device number, connecting pin number, the node name, and predicted valued data for each frame. Predicted value data in file 400 is nine bits long in the horizontal direction, which corresponds to the bit value seen over nine sequential frames. The predicted value data is expressed in terms of a "0" or "1" when the data is associated with a receiving pin. Value "0" and "L" both signify a logic low value, whereas values "1" and "H" both signify a logic high value. Entries in file 400 having identical node names (for example, U1_U3_10 is the same in three places) indicates that the connecting pins of these devices are linked together.

FIG. 5 is an example data packet file 500 generated by boundary scan data extractor/formatter 302. Extractor/formatter 302 compiles all the information required to display the boundary scan test data. Each packet 310 is on a separate line of file 500, and is parsed left to right to obtain the different fields to display. For example, in line 510 of data packet file 500, node name field 512 is parsed as "U1_U3_10", frame cell field 514 is parsed as "000008", device cell field 516 is parsed as "8", device name field 518 is parsed as "U4", pin number field is parsed as "15", predicted value field 522 is parsed as "HLLLHHHLH", actual value field 524 is parsed as "*", predicted device driver field 526 is parsed as "2", and actual device driver field 528 is parsed as "2". Each field is delimited by a space character.

Referring back to FIG. 3, boundary scan tester 314 interfaces with a processor 316. Processor 316 executes a debug environment 318 that communicates with boundary scan tester 314 to set up and execute a boundary scan test, and to display test results in the parallel format of the invention. Processor 316 includes a setup module 320 that causes the test vectors and board netlist to be loaded into the tester 314. Processor 316 also includes a test execution module 322 that handles the instruction and control required to cause boundary scan tester 314 to execute the test. Processor 316 also includes the graphical user interface (GUI) display module 304 that receives a packets 310 from boundary scan tester 314 and displays the test results in a parallel format in accordance with the invention.

Figure 6:
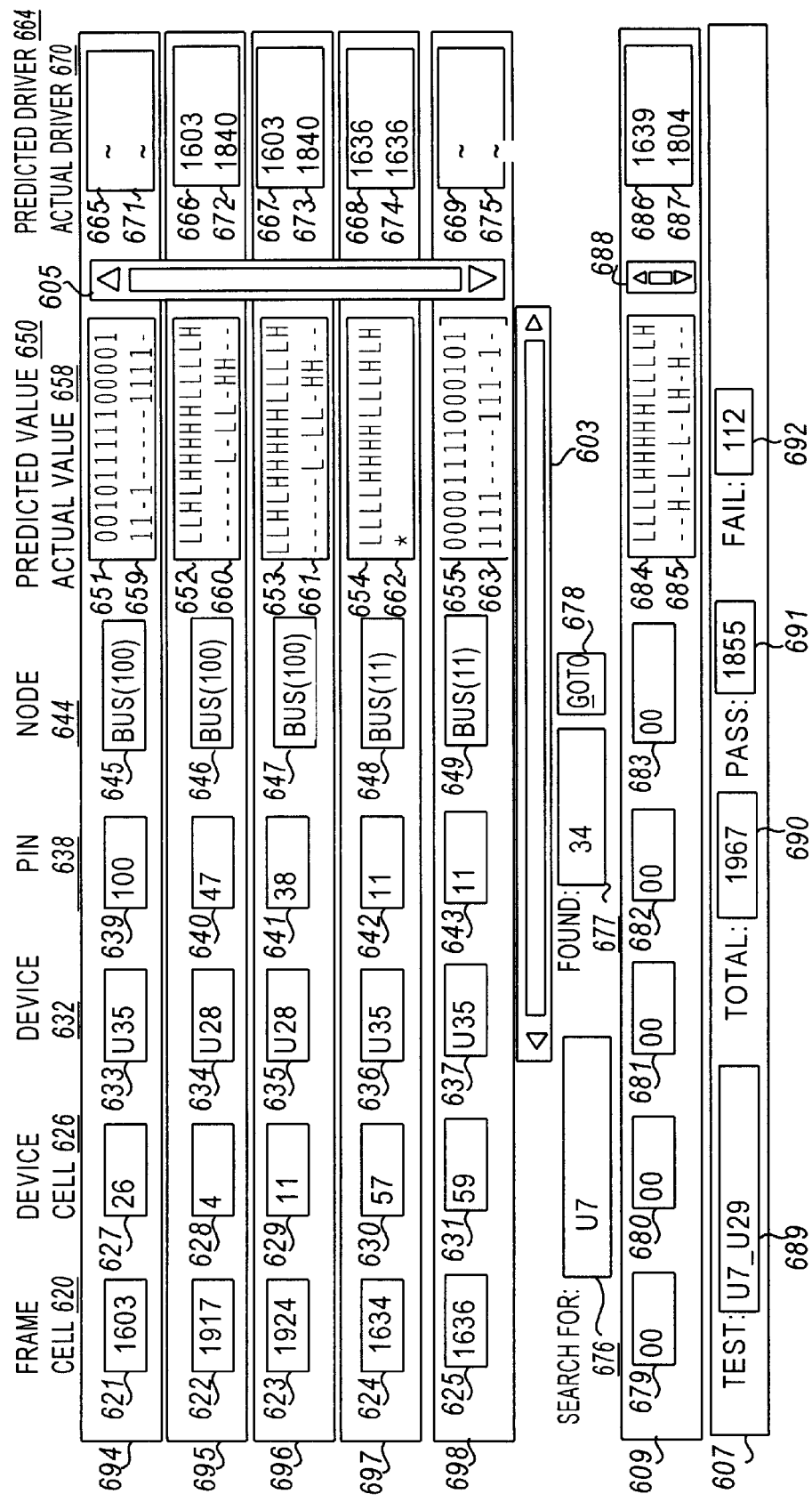
FIG. 6 is an example of a user interface illustrating the parallel view format of the invention.

FIG. 6 is an example user interface 600 illustrating the parallel view of the invention. User interface 600 includes a frame cell region 620, a device cell region 626, a device name region 632, a pin number region 638, a node name region 644, a predicted value region 650, an actual value region 658, a predicted driver region 664, and an actual driver region 670. Each sub-region is arranged in table format, where each row includes all available information for one frame cell. The illustrative embodiment shown in user interface 600 of FIG. 6 displays information for five different frame cells shown in rows 694, 695, 696, 697, and 698. Each row 694, 695, 696, 697, and 698 includes a different field for each subregion 620, 626, 632, 638, 644, 650, 658, 664, and 670. Accordingly, row 694 includes a frame cell field 621, a device cell field 627, a device name field 633, a pin name field 639, a node name field 645, a predicted value field 651, an actual value field 659, a predicted driver field 665, and an actual driver field 671. Rows 695, 696, 697, and 698 each comprise similarly arranged frame cell fields 622, 623, 624, 625, device cell fields 628, 629, 630, 631, device name fields 634, 635, 636, 637, pin name fields 640, 641, 642, 643, node name fields 646, 647, 648, 649, predicted value fields 652, 653, 654, 655, actual value fields 660, 661, 662, 663, predicted driver fields 666, 667, 668, 669, and actual driver fields 672, 673, 674, 675, respectively. Each frame cell field 621 through 625 displays a frame cell number of the boundary-scanned chain being debugged and displayed in its respective row 694, 695, 696, 697, and 698. Each device cell field 627 through 631 displays the device cell number for the given boundary-scan device within the chain for the frame cell number displayed in its corresponding frame cell field in the same row. Because the information displayed in device name sub-region 632, pin name subregion 638, node name sub-region 644, predicted value sub-region 650, and actual value sub-region 658 may be quite lengthy, a scroll bar 603 is provided to allow the user to scroll horizontally through the displayed information. A vertical scroll bar 605 is also provided to allow the user to scroll through each frame cell that is received serially from the boundary-scan tester, to allow the user to view the different frame cells in a parallel format in rows 694 through 698.

Predicted value field 651, 652, 653, 654, 655, and actual value fields 659, 660, 661, 662, 663, are displayed in the illustrative embodiment according to a convention which allows the user to determine whether the predicted and actual values are driven or received values. According to this convention, "0" is a logic low and "1" is a logic high for data that drives a node. In contrast, "L" indicates a logic low and "H" indicates a logic high for data received on a node. Accordingly, device U35, pin 100 is a driver node as shown in row 694. In contrast device U28, pin 47 is a receiving node as shown in row 695. When a node is a receiving node, the predicted and actual driver node is displayed in a predicted driver sub-region 664 and actual driver sub-region 670. Thus, for example, in row 695 because device U28, pin 47 is a receiver node, the predicted driver boundary-scan cell is shown in predicted driver field 666 (e.g., 1603), and the actual driver cell is shown in actual driver field 672 (e.g., 1840).

The data displayed in rows 694 through 698 in the example user interface 600 is interpreted as follows. In row 694, because predicted value field 651 and actual value field 659 comprise "0"s and "1"s, the node on device U35, pin 100 is a receiver node. Accordingly, no predicted driver cell or actual driver cell is displayed in predicted driver cell field 665 and actual driver cell field 671. If the actual value field 659 displays a "*", this means that the actual value matched the predicted value. If the actual value field 659 does not comprise a "*", the actual driver field 659 includes a series of characters that include "0"s and "1"s or "L"s and "H"s when the corresponding bit in the predicted value did not match the actual value. The displayed character displays the actual bit value detected. A "–" in the actual value field indicates that the corresponding bit in the predicted value field matched the actual detected bit for that corresponding bit. Accordingly, the actual value field 659 indicates that bits 0, 1, 3, 9, 10, 11, and 12 did not match the corresponding in and the predicted value field 651. Each of the other bits 2, 4, 5, 6, 8, and 13 did match the predicted corresponding bits in the predicted value field 651.

In row 695, because predicted value field 652 and actual value field 660 contain "L"s and "H"s, the displayed device U28, pin 47 is a receiver node. Accordingly, a predicted driver (e.g., 1603) is displayed in predicted driver field 666, and an actual driver (e.g., 1840) is displayed in actual driver field 672. In this display, actual value field 660 does not comprise a "*" but rather a series of "–"s, "L"s and "H"s. Accordingly, the actual value for frame cell number 1917 as displayed in frame cell field 622 did not match the predicted value displayed in predicted value field 652. Furthermore, the actual driver cell displayed in actual driver field 672 did not match the predicted driver cell displayed in predicted driver cell 666. It will be appreciated by those skilled in the art that his parallel display of the data greatly assists the debugging engineer in determining the source of why the test does not work. For example, because the actual driver did not match the predicted driver as shown in actual driver field 672 and predicted driver field 666, this indicates that there may be a mis-wiring on device U28, pin 47. A similar mismatch occurs in frame cell number 1924 shown in row 696. Again, the actual driver did not match the predicted driver.

Frame cell number 1634 shown in row 697 illustrates a receiving node on device U35, pin 11, and the actual value displayed in actual value field 662 matches the predicted value displayed in predicted value field 654. This is indicated by the "*" and actual value field 662. Also, the predicted driver and actual driver match as displayed in the predicted driver field 668 and actual driver field 674.

Row 698 displays a frame cell number 1636. This row indicates that device U35, pin 11 is a driver node as indicated by the "0"s and "1"s in predicted value field 655 and actual value field 663. However, because actual driver field 663 does not contain a "*", but rather a series of "1"s and "–"s, this indicates that the predicted value did not match the actual value.

The user interface 600 may also include a searching feature. In the illustrative embodiment shown in FIG. 6, a search for entry box 676 is provided to allow the user to specify a character string on which the data packets are searched and a list of packets containing the specified string is generated. Typically the search for function is used to search on a node name or a signature seen on a node. A "found" box 677 displays the number of frame cells in which a match was found on the string specified in search for entry box 676. Accordingly, in user interface 600, device name U7 is displayed as the desired string to search for and 34 entries were found in the captured serial bit stream from the boundary-scan test. A frame cell field 679, device cell name field 680, a device name field 681, a pin name field 682, and node name field 683, a predicted value field 684, an actual value field 685, a predicted driver field 686, and an actual driver field 687 are provided to display a frame cell that was found by the search specified in search for entry box 676. A "Goto" function is provided by a Goto button 678 which allows the user to display, in the main view, a particular found frame cell in the search display comprising three fields 679 through 687. Also provided is a scroll bar 688 which allows the user to scroll through each of the found frame cells specified by this search.

User interface 600 also provides a statistics bar 607. Statistics bar 607 includes a test name field 689 which displays the name of the test from which the currently displayed data was derived, a total frame cells field 690 which displays the total number of frame cells obtained by the test, a pass field 691 which displays the number of frame cells whose predicted values match their actual values and has passed the test, and a fail field 692 which displays the number of frame cells whose predicted value did not match the actual value and therefore failed the test.

Tool bar 601 provides a file menu 604, a view menu 606. A sort menu 608, and a show menu 610. In the preferred embodiment, each of these menus is implemented as a pull-down menu. File menu 604 allows a user to open a data file, close a data file, save the data to a text file, and exit the display application. The view menu provides options for formatting the displays of the screen, including more or less verbose forms. In an "Errors Only" view, only those frame cells where a mismatch occurred between the actual and predicted values are displayed. In a "Passing Only" format, all frame cells whose actual values matched their predicted values are displayed. In an "Entire Chain" view, all frame cells captured by the boundary-scan tester are displayed. The sort menu 608 allows the user to display data either sorted by frame cell or by node name. The example user interface 600 illustrates the data sorted by node name.

It will be appreciated by those skilled in the art that the user interface display supplied by the invention presents boundary scan test information in a format useful to the user for debugging boundary scan circuits. The predicted and actual values for each frame cell are lined up one on top of another to provide an instant indication of whether a match occurred, and if not, which bits are not matched. In addition, the predicted driver and actual drivers of a node are displayed to assist the user in pinpointing the source of an error if the driver display indicates a mismatch.

In the preferred embodiment, the graphical user interface for displaying boundary scan test data provides capability for displaying interesting correlations in the data to assist the user in debugging the circuit under test, including devices driving at fail, devices receiving at fail, devices driving only passes, devices receiving only passes, nodes always failing, nodes sometimes failing, and nodes always passing. The Show button 610 in toolbar 601 is a pulldown menu that lists these options. "Devices driving at fail" lists all the devices that ever drove a boundary scan receiver with failed data. There may be dozens of failing receivers over many ICs, but the list of driving devices may be small, indicating trouble with them. "Devices receiving at fail" lists all the devices that received bad data. This list could also be short, indicating localized problems. "Devices driving only passes" lists all devices that never were seen driving bad data by any receiver. "Devices receiving only passes" lists all devices where all receivers are passing. "Nodes always failing" lists those nodes that have all receivers failing. "Nodes sometimes failing" lists those nodes that have at least one passing and one failing receiver. "Nodes always passing" lists those nodes that have all receivers passing.

Figure 7:
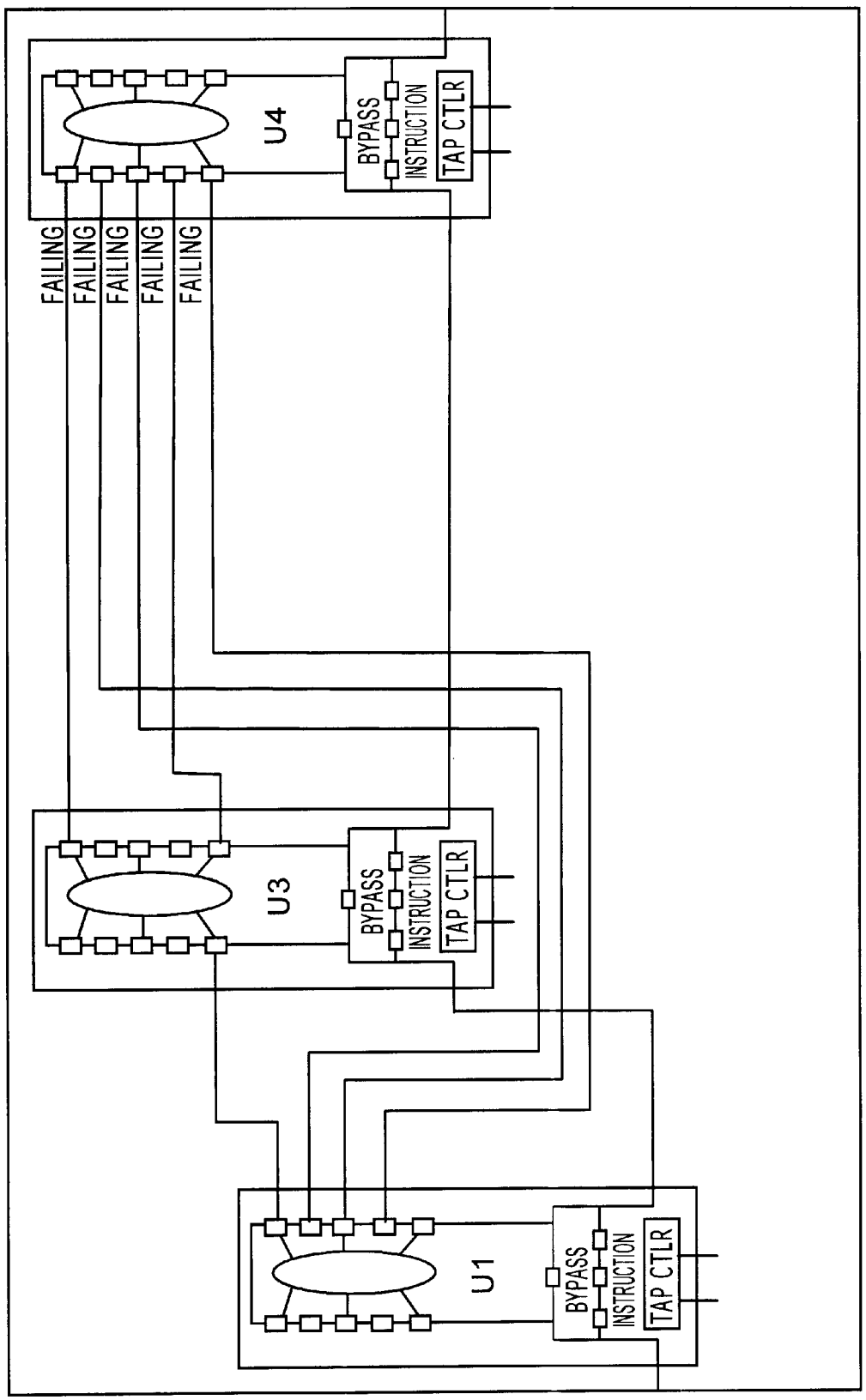
FIG. 7 is an example of a boundary scan circuit illustrating an example of a "device receiving at fail"

FIG. 7 is an example of a boundary scan circuit illustrating an example of a "device receiving at fail". In this example, ICs U1 and U3 both drive IC U4. However, device U4 receives all failing input. Accordingly, the "Devices receiving at fail" list generated by the Show button 610 on toolbar 601 that would be displayed would identify IC U4 as the potential problem in the circuit.

Figure 8:
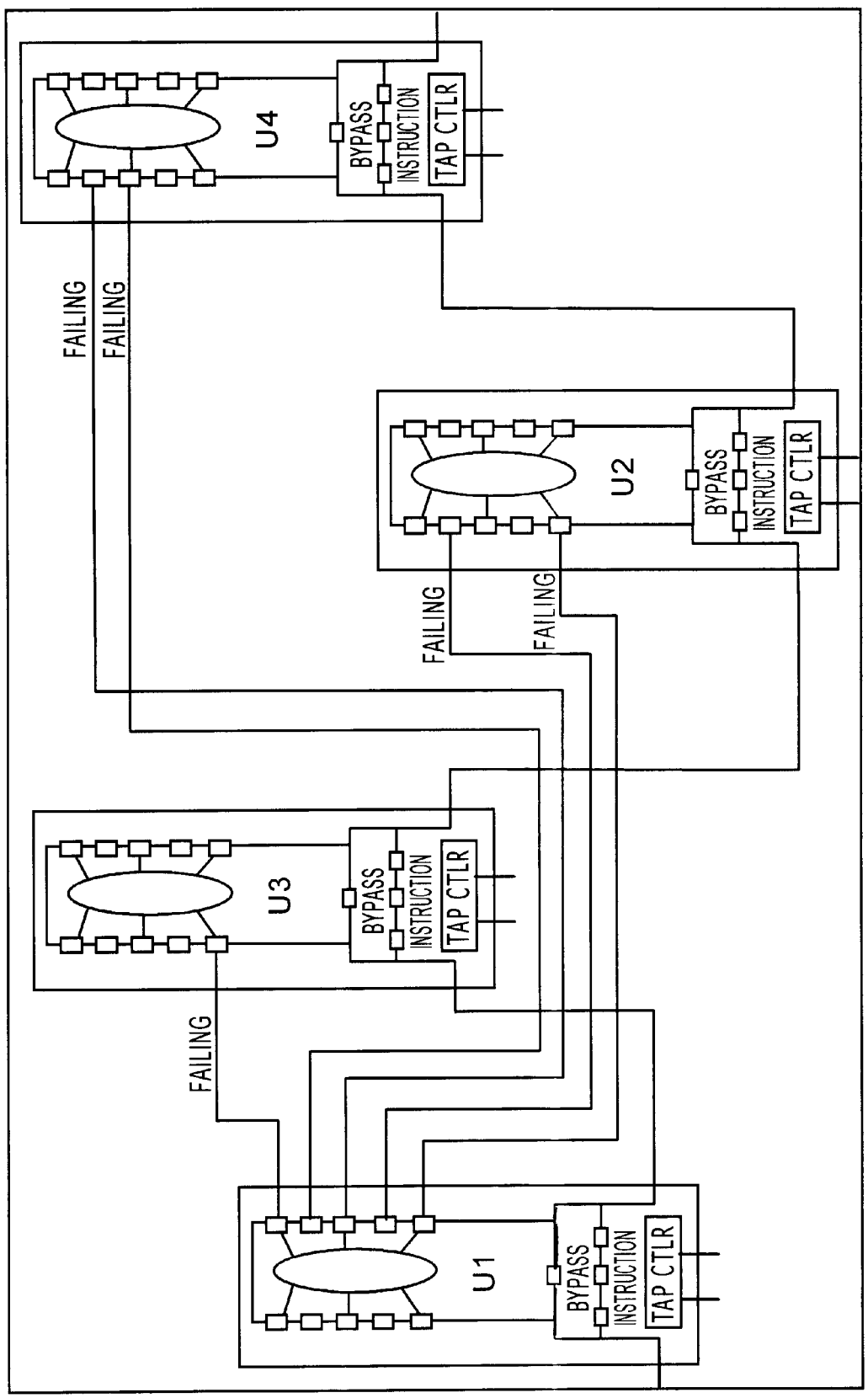
FIG. 8 is an example of a boundary scan circuit illustrating an example of a "device driving at fail".

FIG. 8 is an example of a boundary scan circuit illustrating an example of a "device driving at fail". In this example, devices U2, U3, and U4 all receive failing values from device U1. Accordingly, the list of failing driving devices that would be displayed would indicate a potential problem with device U1.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A system for displaying boundary scan test data generated by a boundary scan testing device, comprising:
    a graphical user interface process which receives a data packet, said data packet corresponding to a boundary scan frame and comprising a frame cell identifier, a node identifier, a predicted value, and an actual value, said graphical user interface displaying said frame cell identifier, said node identifier, said predicted value and said actual value, wherein said predicted value and said actual value are aligned in a parallel format that visually alerts a viewer to a match condition or a mis-match condition between said predicted value and said actual value.

2. The system in accordance with claim 1, wherein:
    said actual value and said predicted value are, vertically aligned to present an immediate visual indication of said match condition or said mis-match condition.

3. The system in accordance with claim 1, wherein:
    said mismatch condition is displayed in connection with a first color; and
    said match condition is displayed in connection with a second color.

4. The system in accordance with claim 3, wherein:
    said actual value and said predicted value are vertically aligned to present an immediate visual indication of said match condition or said mis-match condition.

5. A system in accordance with claim 1, wherein:
    said node identifier comprises a device cell identifier, said device cell identifier indicating which of a plurality of device cells in a boundary scan circuit under test that said actual value and said predicted value are associated with; and
    said graphical user interface displaying said device cell identifier in association with said predicted value and said actual value.

6. A system in accordance with claim 5, wherein:
    said node identifier comprises a device name identifier and a pin number identifier, said device name identifier indicating which of a device in a boundary scan circuit under test comprises said device cell indicated by said device cell identifier, and said pin number identifier indicating which of a plurality of pins of said device named by said device name identifier that said actual value and said predicted value are associated with; and
    said graphical user interface displaying said device name identifier and said pin number identifier in association with said predicted value and said actual value.

7. A system in accordance with claim 1, wherein:
said node identifier comprises a predicted driver identifier and an actual identifier, said predicted driver identifier indicating which of a device cell in a boundary scan circuit under test was predicted to drive said device cell associated with said frame cell identifier, and said actual driver identifier indicating which of a device cell in said boundary scan circuit under test actually drove said device cell associated with said frame cell information identifier; and
said graphical user interface displaying said said predicted driver identifier and an actual identifier in association with said predicted value and said actual value.

8. The system in accordance with claim 1, comprising:
a sorting function which receives a sorting condition and displays said data packet according to said sorting condition.

9. The system in accordance with claim 1, comprising:
a filter function which receives a filter condition and displays only those of said data packets that match said filter condition.

10. The system in accordance with claim 1, comprising:
a search function which receives a search criteria and displays those of said data packets that match said search criteria.

11. The system in accordance with claim 1, comprising:
a data formatter which receives said boundry scan test data generated by said boundary scan testing device, parses an actual value associated with a boundary scan cell from said boundary scan test data, associates said actual value with a set of frame cell information, and packetizes said set of frame cell information, said predicted value and said actual value into said data packet.

12. A graphical user interface for displaying boundary scan test data obtained during a boundary scan test of a circuit under test by a boundary scan testing device, said boundary scan test data comprising a data packet, said data packet comprising a frame cell identifier identifying a boundary scan test data frame, a node identifier, a predicted value associated with said frame cell identifier of said boundary scan cell, and an actual value obtained by said boundary scan testing device associated with said frame, comprising:
a frame cell identifier field which displays said frame cell identifier;
a node identifier field which displays said node identifier;
a predicted value field which displays said predicted value; and
an actual value field which displays said actual value; and
wherein said predicted value field and said actual value field are aligned in a parallel format that visually alerts a viewer to a match condition or a mis-match condition between said predicted value and said actual value.

13. The graphical user interface in accordance with claim 12, wherein:
said actual value and said predicted value are vertically aligned to present an immediate visual indication of said match condition or said mis-match condition.

14. The graphical user interface in accordance with claim 12, wherein:
said mismatch condition is displayed in connection with a first color; and
said match condition is displayed in connection with a second color.

15. A graphical user interface in accordance with claim 12, comprising:
a device identifier field, said device name field displaying a device name, said device identifier extracted from said data packet.

16. A method for displaying boundary scan test data obtained from boundary scan cells of a circuit under test as generated by a boundary scan testing device, comprising:
receiving said boundary scan test data generated by said boundary scan testing device;
extracting a frame cell identifier from said boundary scan test data;
extracting a predicted value associated with said frame cell from said boundary scan test data, said predicted value comprising a prediction of a value associated with a boundary scan cell;
extracting an actual value associated with said frame cell from said boundary scan test data, said actual value comprising a test value associated with said boundary scan cell obtained by said boundary scan test;
extracting a node identifier associated with said predicted value and said actual value from said boundary scan test data; and
displaying said frame cell identifier, said node identifier, said predicted value and said actual value, wherein said predicted value and said actual value are aligned in a parallel format that visually alerts a viewer to a match condition or a mis-match condition between said predicted value and said actual value.

17. The method in accordance with claim 16, wherein:
said displaying step comprises vertically aligning said actual value and said predicted value to present an immediate visual indication of said match condition or said mis-match condition.

18. The method in accordance with claim 16, wherein:
said displaying step comprises displaying said mismatch condition in connection with a first color and displaying said match condition in connection with a second color.

19. The method in accordance with claim 16, comprising:
extracting a device name identifier and a pin number identifier, said device name identifier indicating which of a device cell in said boundary scan circuit under test comprises said device cell indicated by said device cell identifier, and said pin number identifier indicating which of a plurality of pins of said device named by said device name identifier that said actual value and said predicted value are associated with; and
displaying said device name identifier and said pin number identifier in connection with said predicted value and said actual value.

20. The method in accordance with claim 16, comprising:
extracting a predicted driver identifier and an actual driver identifier from said boundary scan test data, said predicted driver identifier indicating which of a device cell in said boundary scan circuit under test was predicted to drive said device cell associated with said frame cell information, and said actual driver identifier indicating which of a device cell in said boundary scan circuit under test actually drove said device cell associated with said actual value and said predicted value; and
displaying said predicted driver identifier and an actual driver identifier in connection with said predicted value and said actual value.

* * * * *